(12) United States Patent
Chen et al.

(10) Patent No.: US 7,129,536 B2
(45) Date of Patent: Oct. 31, 2006

(54) NON-PLANAR NON-VOLATILE MEMORY CELL WITH AN ERASE GATE, AN ARRAY THEREFOR, AND A METHOD OF MAKING SAME

(75) Inventors: Bomy Chen, Cupertino, CA (US); Sohrab Kianian, Los Altos Hills, CA (US); Yaw Wen Hu, Cupertino, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 145 days.

(21) Appl. No.: 10/934,246

(22) Filed: Sep. 2, 2004

(65) Prior Publication Data
US 2006/0043459 A1    Mar. 2, 2006

(51) Int. Cl.
*H01L 29/788* (2006.01)
(52) U.S. Cl. ............... 257/316; 257/319; 257/320; 257/322; 257/622; 438/689
(58) Field of Classification Search ........... 257/316, 257/319, 320, 322
See application file for complete search history.

(56) References Cited

U.S. PATENT DOCUMENTS

| | | | |
|---|---|---|---|
| 5,029,130 A | | 7/1991 | Yeh |
| 5,386,132 A | * | 1/1995 | Wong ............... 257/316 |
| 5,495,441 A | * | 2/1996 | Hong ............... 365/185.01 |
| 5,780,341 A | | 7/1998 | Ogura |
| 5,856,943 A | | 1/1999 | Jeng |
| 6,091,104 A | | 7/2000 | Chen |
| 6,130,453 A | * | 10/2000 | Mei et al. ............... 257/315 |
| 6,329,685 B1 | | 12/2001 | Lee |
| 6,873,006 B1 | * | 3/2005 | Chen et al. ............... 257/316 |
| 6,958,273 B1 | * | 10/2005 | Chen et al. ............... 438/259 |

* cited by examiner

*Primary Examiner*—Gene M. Munson
(74) *Attorney, Agent, or Firm*—DLA Piper US LLP

(57) ABSTRACT

A memory cell has a trench formed into a surface of a semiconductor substrate, and spaced apart source and drain regions with a channel region formed therebetween. The source region is formed underneath the trench, and the channel region includes a first portion extending vertically along a sidewall of the trench and a second portion extending horizontally along the substrate surface. An electrically conductive floating gate is disposed in the trench adjacent to and insulated from the channel region first portion. An electrically conductive control gate is disposed over and insulated from the channel region second portion. An erase gate is disposed in the trench adjacent to and insulated from the floating gate. A block of conductive material has at least a lower portion thereof disposed in the trench adjacent to and insulated from the erase gate, and electrically connected to the source region.

24 Claims, 15 Drawing Sheets

NON-PLANAR NON-VOLATILE MEMORY CELL WITH AN ERASE GATE, AN ARRAY THEREFOR, AND A METHOD OF MAKING SAME

TECHNICAL FIELD

The present invention relates to a non-planar, non-volatile floating gate memory cell, and an array of such cells and a method of making same in a semiconductor substrate. More particularly, the present invention relates to a such a memory cell having a floating gate, a control gate and an erase gate.

BACKGROUND OF THE INVENTION

Non-volatile semiconductor memory cells using a floating gate to store charges thereon and memory arrays of such non-volatile memory cells formed in a semiconductor substrate are well known in the art. Typically, such floating gate memory cells have been of the split gate type, or stacked gate type.

It is also known to form memory cell elements over non-planar portions of the substrate. For example, U.S. Pat. No. 5,780,341 (Ogura) discloses a number of memory device configurations that includes a step channel formed in the substrate surface. While the purpose of the step channel is to inject hot electrons more efficiently onto the floating gate, these memory device designs are still deficient in that it is difficult to optimize the size and formation of the memory cell elements as well the necessary operational parameters needed for efficient and reliable operation.

The use of three gates in a non-volatile memory cell is also well known in the art. See for example U.S. Pat. Nos. 5,856,943 or 6,091,104.

Finally, self-aligned methods to form non-volatile split gate floating gate memory cells are also well known. See U.S. Pat. No. 6,329,685.

Erasure of charges on a floating gate through the mechanism of poly-to-poly tunneling of electrons through Fowler-Nordheim tunneling is also well known in the art. See U.S. Pat. No. 5,029,130, whose disclosure is incorporated herein by reference in its entirety.

Thus, it is one object of the present invention to create a self-aligned method to make a non-planar split gate floating non-volatile memory cell, and an array of such cells, in which the cell has three gates: a floating gate, a control gate and an erase gate, wherein charges are removed from the floating gate to the erase gate through the mechanism of Fowler-Nordheim tunneling.

SUMMARY OF THE INVENTION

In the present invention, an electrically programmable and erasable memory device comprises a substrate of a semiconductor material having a first conductivity type and a horizontal surface. A trench is formed into the surface of the substrate. A first and second spaced-apart regions are formed in the substrate, each has a second conductivity type, with a channel region formed in the substrate between the first region and the second region. The first region is formed underneath the trench. The channel region includes a first portion that extends substantially along a sidewall of the trench and a second portion that extends substantially along the surface of the substrate. An electrically conductive floating gate has at least a lower portion thereof disposed in the trench adjacent to and insulated from the channel region first portion for controlling a conductivity of the channel region first portion. An electrically conductive erase gate has at least a lower portion thereof disposed in the trench adjacent to and insulated from the floating gate. An electrically conductive control gate is disposed over and insulated from the channel region second portion for controlling the conductivity of the channel region second portion.

The present invention also relates to an array of the foregoing described memory cells. Finally, the present invention relates to a method of manufacturing the foregoing described array of memory cells.

DETAILED DESCRIPTION OF THE PREFERRED EMBODIMENTS

The method of the present invention is illustrated in FIGS. 1A to 1F and 2A to 2N (which show the processing steps in making the memory cell array of the present invention). The method begins with a semiconductor substrate 10, which is preferably of P type and is well known in the art. The thicknesses of the layers described below will depend upon the design rules and the process technology generation. What is described herein is for the 0.11 process. However, it will be understood by those skilled in the art that the present invention is not limited to any specific process technology generation, nor to any specific value in any of the process parameters described hereinafter.

Isolation Region Formation

Figure 1A:
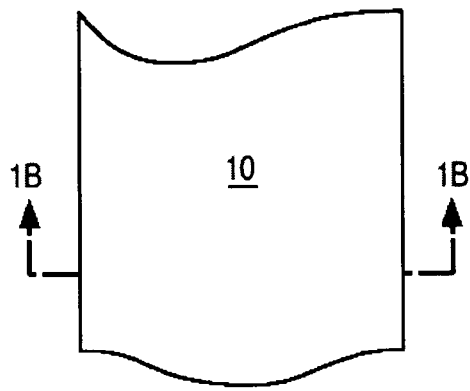
FIG. 1A is a top view of a semiconductor substrate used in the first step of the method of present invention to form isolation regions.
Figure 1B:
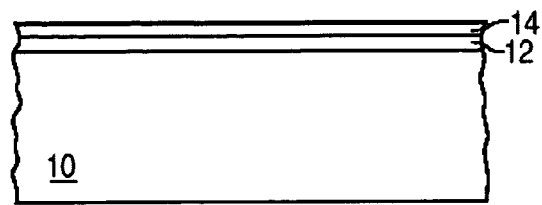
FIG. 1B is a cross sectional view of the structure taken along the line 1B—1B showing the initial processing steps of the present invention.

FIGS. 1A to 1F illustrate the well known STI method of forming isolation regions on a substrate. Referring to FIG. 1A there is shown a top plan view of a semiconductor substrate 10 (or a semiconductor well), which is preferably of P type and is well known in the art. First and second layers of material 12 and 14 are formed (e.g. grown or deposited) on the substrate. For example, first layer 12 can be silicon dioxide (hereinafter "oxide"), which is formed on the substrate 10 by any well known technique such as oxidation or oxide deposition (e.g. chemical vapor deposition or CVD) to a thickness of approximately 50–150 Å. Nitrogen doped oxide or other insulation dielectrics can also be used. Second layer 14 can be silicon nitride (hereinafter "nitride"), which is formed over oxide layer 12 preferably by CVD or PECVD to a thickness of approximately 1000–5000 Å. FIG. 1B illustrates a cross-section of the resulting structure.

Figure 1D:
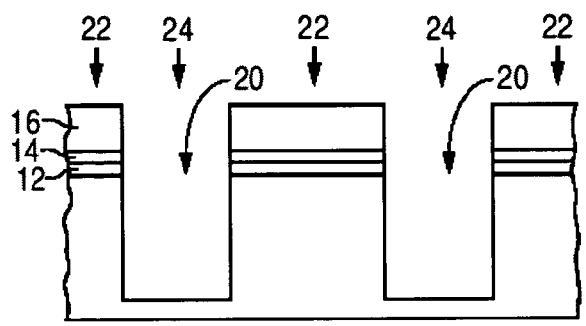
FIG. 1D is a cross sectional view of the structure in FIG. 1C taken along the line 1D—1D showing the isolation trenches formed in the structure.
Figure 1C:
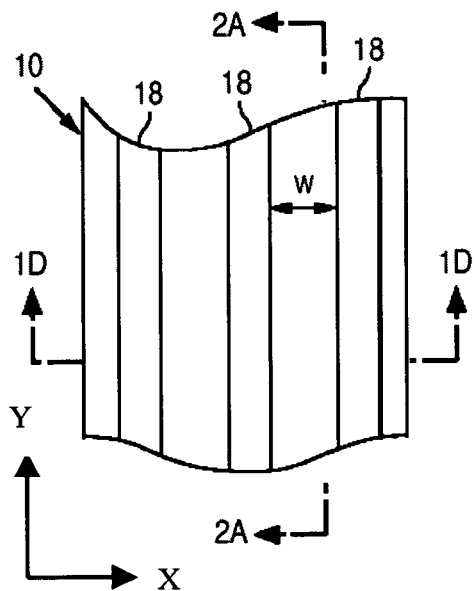
FIG. 1C is a top view of the structure showing the next step in the processing of the structure of FIG. 1B, in which isolation regions are defined.

Once the first and second layers 12/14 have been formed, suitable photo resist material 16 is applied on the nitride layer 14 and a masking step is performed to selectively remove the photo resist material from certain regions (stripes 18) that extend in the Y or column direction, as shown in FIG. 1C. Where the photo-resist material 16 is removed, the exposed nitride layer 14 and oxide layer 12 are etched away in stripes 18 using standard etching techniques (i.e. anisotropic nitride and oxide/dielectric etch processes) to form trenches 20 in the structure. The distance W between adjacent stripes 18 can be as small as the smallest lithographic feature of the process used. A silicon etch process is then used to extend trenches 20 down into the silicon substrate 10 (e.g. to a depth of approximately 500 Å to several microns), as shown in FIG. 1D. Where the photo resist 16 is not removed, the nitride layer 14 and oxide layer 12 are maintained. The resulting structure illustrated in FIG. 1D now defines active regions 22 interlaced with isolation regions 24.

Figure 1E:
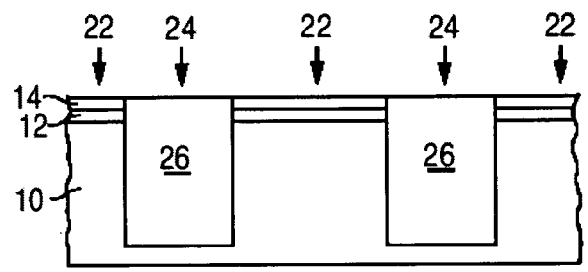
FIG. 1E is a cross sectional view of the structure in FIG. 1D showing the formation of isolation blocks of material in the isolation trenches.

The structure is further processed to remove the remaining photo resist 16. Then, an isolation material such as silicon dioxide is formed in trenches 20 by depositing a thick oxide layer, followed by a Chemical-Mechanical-Polishing or CMP etch (using nitride layer 14 as an etch stop) to remove the oxide layer except for oxide blocks 26 in trenches 20, as shown in FIG. 1E. The remaining nitride and oxide layers 14/12 are then removed using nitride/oxide etch processes, leaving STI oxide blocks 26 extending along isolation regions 24, as shown in FIG. 1F.

The STI isolation method described above is the preferred method of forming isolation regions 24. However, the well known LOCOS isolation method (e.g. recessed LOCOS, poly buffered LOCOS, etc.) could alternately be used, where the trenches 20 may not extend into the substrate, and isolation material may be formed on the substrate surface in stripe regions 18. FIGS. 1A to 1F illustrate the memory cell array region of the substrate, in which columns of memory cells will be formed in the active regions 22 which are separated by the isolation regions 24. Preferably, isolation blocks 26 are also formed in a periphery region (not shown) during the same STI or LOCOS process described above.

Memory Cell Formation

Figure 1F:
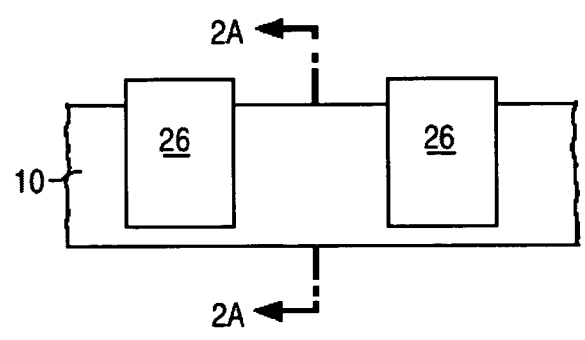
FIG. 1F is a cross sectional view of the structure in FIG. 1E showing the final structure of the isolation regions.
Figure 2A:
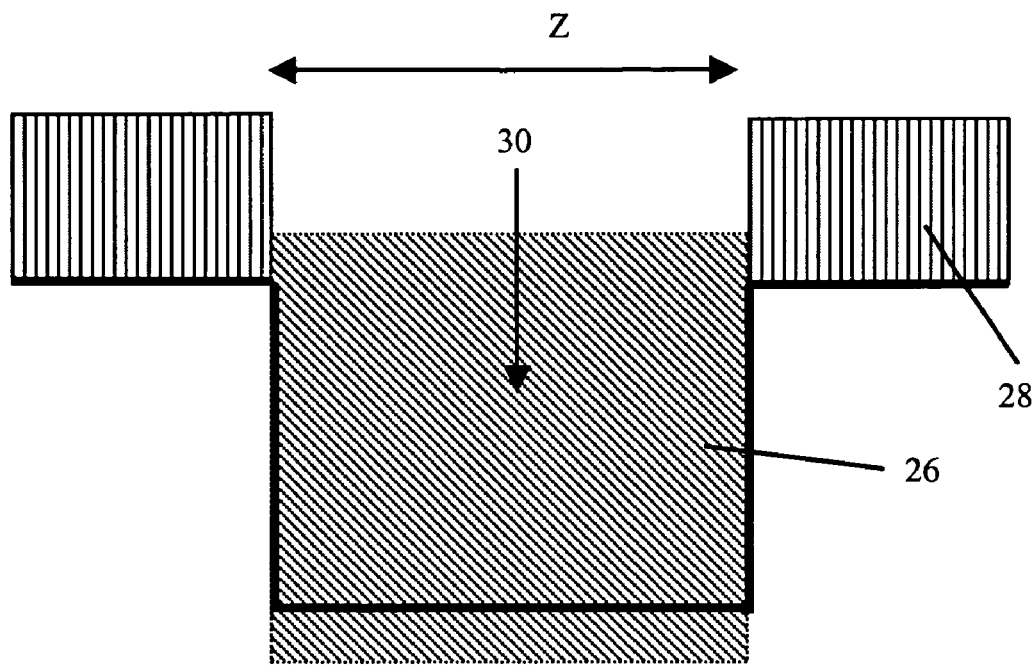
FIGS. 2A–2N are cross sectional views of the semiconductor structure in FIG. 1F taken along the line 2A—2A showing in sequence the steps in the first method for processing the semiconductor structure of FIG. 1F in the formation of a non-volatile memory array of floating gate memory cells of the present invention.

The structure shown in FIG. 1F is further processed as follows. FIGS. 2A to 2N show the cross sections of the structure in the active regions 22 from a view orthogonal to that of FIG. 1F (along line 2A—2A as shown in FIGS. 1C and 1F).

An insulation layer 28 (preferably silicon nitride) is first formed over the substrate 10. Photoresist (not shown) is then formed over the silicon nitride 28. The photoresist is patterned in a direction orthogonal to the active region resulting in stripes of photoresist in the X direction spaced apart from one another in the Y direction. Using the photoresist as a mask, the silicon nitride 28 is patterned. The distance z between adjacent stripes of silicon nitride 28 can be as small as the smallest lithographic feature of the process used. Using the silicon nitride 28 as a mask, silicon of the substrate 10 is then anisotropically etched in the regions between the silicon nitride 28. Since the silicon substrate 10 is not continuous because of the STI 26 formed between adjacent active regions, the anisotropic etching of the silicon substrate 10 results in "pockets". The STI 26 is formed between the pockets 30 of etched silicon. The resultant structure is shown in FIG. 2A. Henceforth, the background of the STI 26 will not be shown in the subsequent diagrams.

The structure shown in FIG. 2A is then further processed as follows. First, ion implantation is made into the bottom wall of the pocket 30 forming a source/drain region 32. Thereafter, a thin layer, on the order of 80–120 angstroms, of silicon dioxide 34 is deposited everywhere. The silicon dioxide 34 is deposited along the side walls and the bottom wall of the pocket 30, as well as along the side wall of the exposed silicon nitride 28. Thereafter, a heavily n+++ doped polysilicon layer 36 is deposited everywhere. The heavily doped polysilicon layer 36 is deposited to a thickness of approximately 100–500 angstroms. The heavily doped polysilicon 36 is deposited on the silicon dioxide 34 and thus is formed along the side walls of the pocket 30 and along the bottom wall of the pocket 30, as well along the side walls of the silicon nitrite 28 covered by the silicon dioxide 34. Thereafter, undoped or lightly doped polysilicon 38 is deposited everywhere filling the pocket 30. The structure is then subject to a cmp (chemical mechanical polishing) process in which the structure is polished to be level with the top surface of the silicon nitride 28. The resultant structure is shown in FIG. 2B.

Figure 2B:
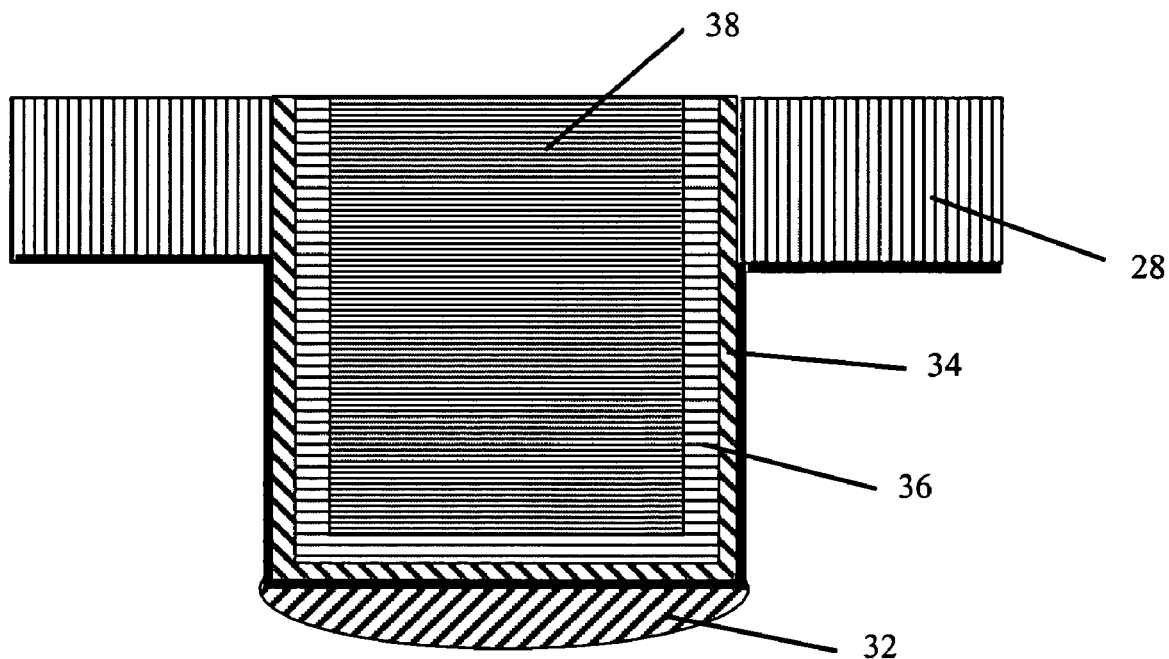

Next, the structure shown in FIG. 2B is subject to an etching process which etches polysilicon. Since there is a difference between the polysilicon 38 and the heavily doped polysilicon 36, the etchant would attack the rate of etch differently. As a result, the etchant would attack the heavily doped polysilicon 36 faster than the lightly or undoped polysilicon 38 resulting in an upward profile as shown in FIG. 2C.

Figure 2C:
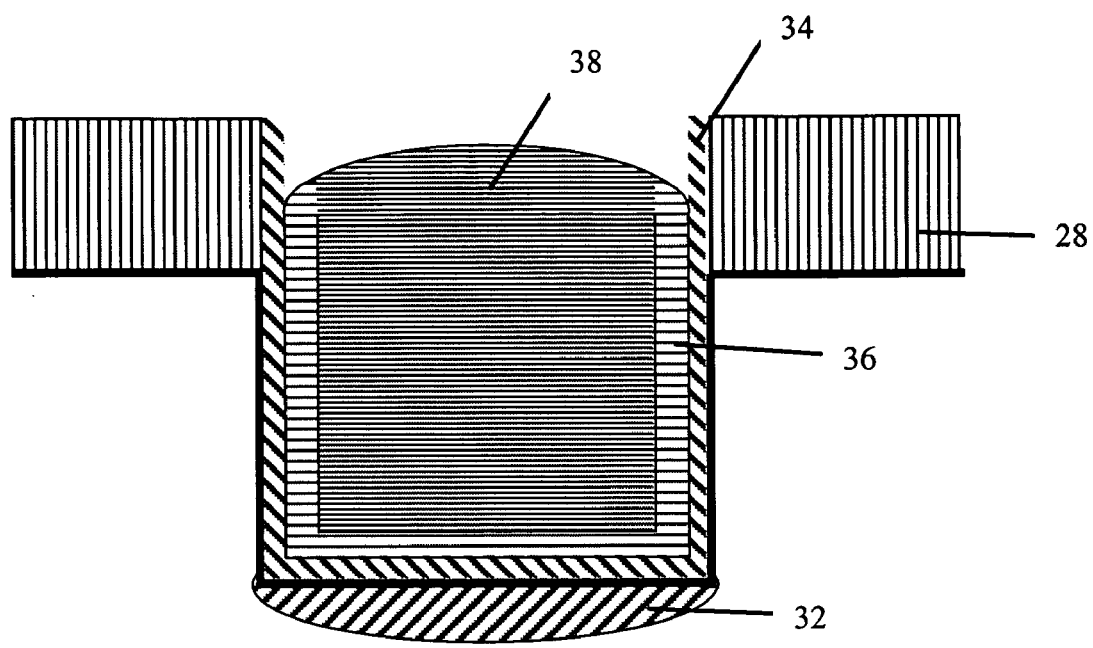
Figure 2D:
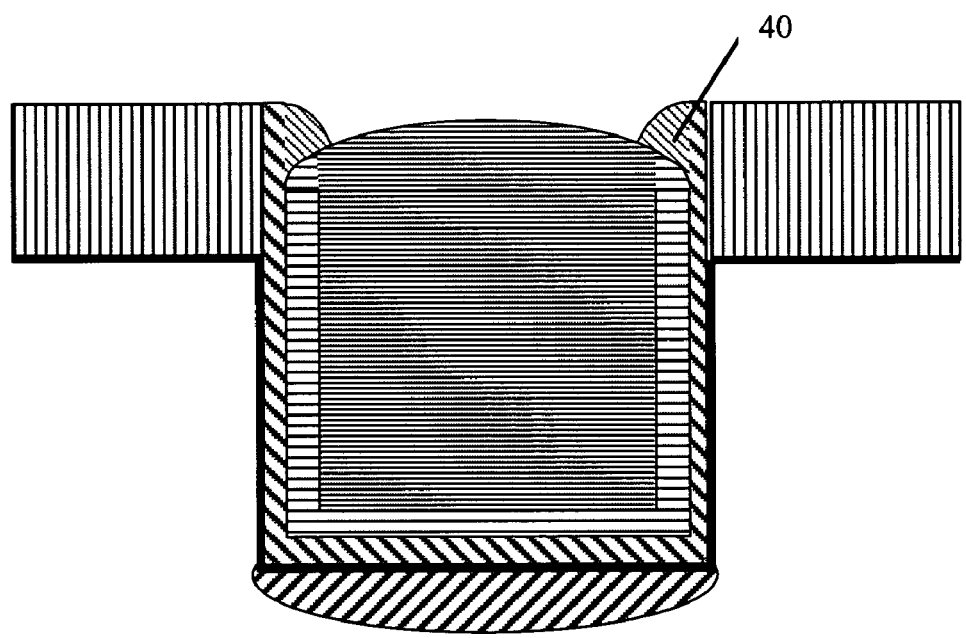

The structure shown in FIG. 2C is then subject to a deposition process of depositing a layer of silicon dioxide 40 everywhere. The layer of silicon dioxide 40 is then anisotropically etched resulting in the formation of spacers 40 of silicon dioxide abutting the silicon dioxide 34 which is immediately adjacent to the silicon nitride 28. The spacer 40 has a width which is larger or thicker than the width of the heavily doped polysilicon 36. The resultant structure is shown in FIG. 2D.

Using the spacer 40 as a mask, the polysilicon 38 is anisotropically etched. Further, the anisotropic etching proceeds through the heavily doped polysilicon 36 which is deposited on the bottom of the pocket 30. Thereafter, a layer 42 of silicon dioxide (approximately 150–250 angstroms thick) deposited by an HTO (high temperature oxide) process is made on the structure. The layer 42 then lines pocket 30 and is adjacent to the side wall of the pocket and is deposited along the bottom wall of the pocket 30. The resultant structure is shown on FIG. 2E.

Figure 2E:
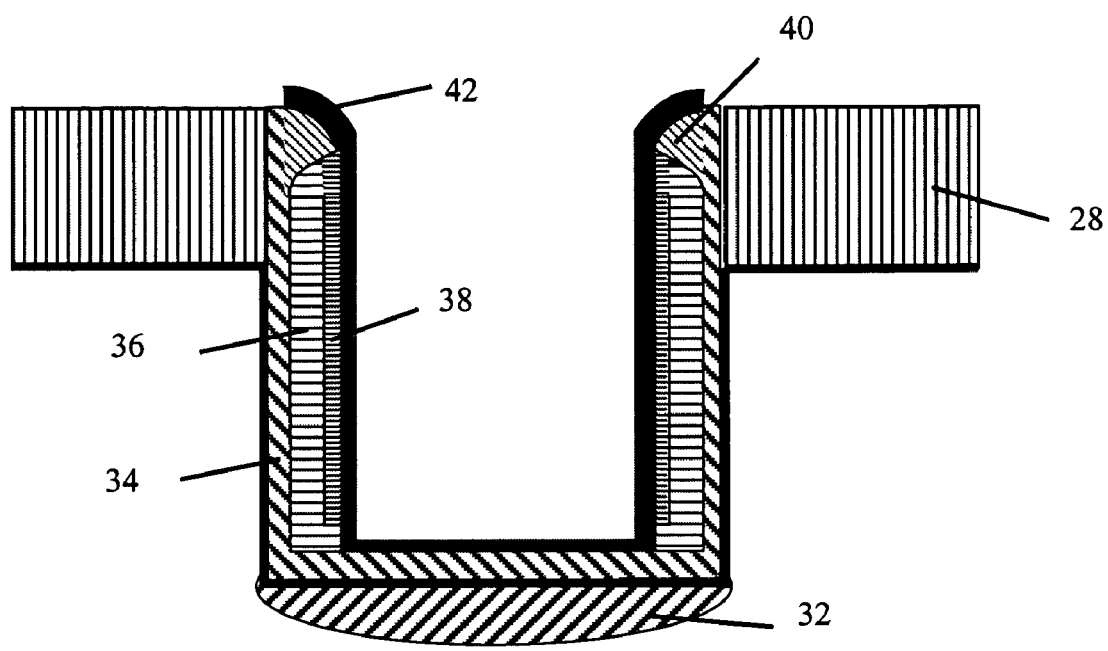
Figure 2F:
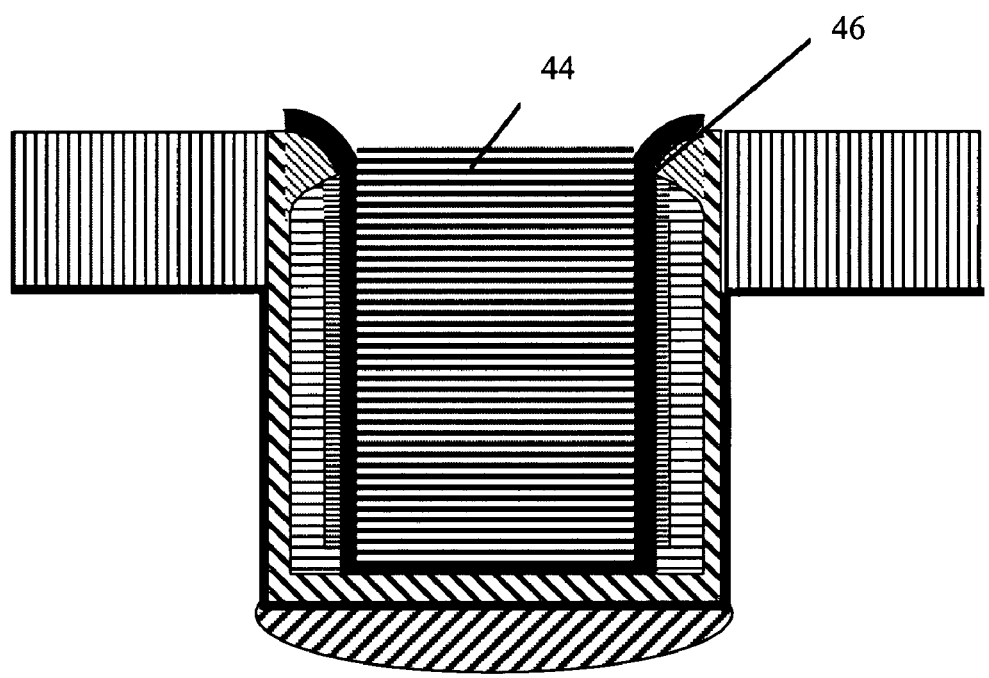

Polysilicon 44 is then deposited filling the pocket 30 of the structure shown in FIG. 2E. The resultant structure is shown in FIG. 2F. The polysilicon 44 is deposited for such a time as to permit the polysilicon 44 to fill the pocket to a level above the tip 46. The tip 46 is at the juncture of the to-be-formed floating gate which comprises a thin layer of the heavily doped polysilicon 36 and a thin layer of the lightly doped or undoped polysilicon 38 and is immediately adjacent to the HTO oxide 42 and is at a location which is farthest away from the bottom wall of the pocket 30. The resultant structure is shown in FIG. 2F.

The structure shown in FIG. 2F is then subject to a wet etch, i.e., isotropic etch, etching the HTO deposited silicon dioxide layer 42 and the silicon dioxide spacer 40. The wet etch on the structure shown in FIG. 2F proceeds until the tip 46 is exposed. Thereafter, another deposition of HTO silicon dioxide is performed covering the tip 46. Polysilicon is then applied everywhere else in the pocket 30 filling the void left by the etching of the HTO layer 42 and the silicon dioxide spacer 40. The polysilicon is then etched back anisotropically so that it is slightly below the top surface of the silicon nitride 28. As a result, the polysilicon 44 fills the pocket and "flares outwardly" as shown in FIG. 2G.

Figure 2G:
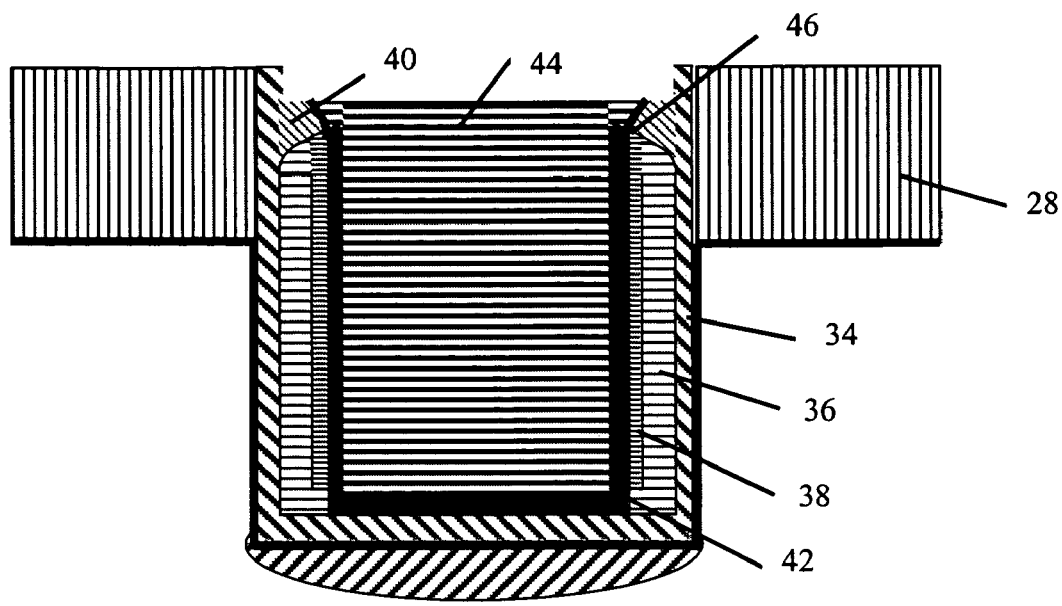

The structure in FIG. 2G is then subject to a silicon nitride layer deposition which is then anisotropically etched until the top surface of the polysilicon 44 is reached with the polysilicon 44 used as an etch stop. This forms silicon nitride spacers 48 adjacent to the silicon dioxide 34. With the silicon nitride spacers 48 as masks, the polysilicon 44 is then subject to an anisotropic etch until the HTO deposited layer of silicon dioxide 42 is reached. The etchant is then changed to anisotropically etch the silicon dioxide 42 and the silicon dioxide layer 34 until the bottom of the trench which is the silicon substrate 10 is reached. The resultant structure is shown in FIG. 2H.

Figure 2H:
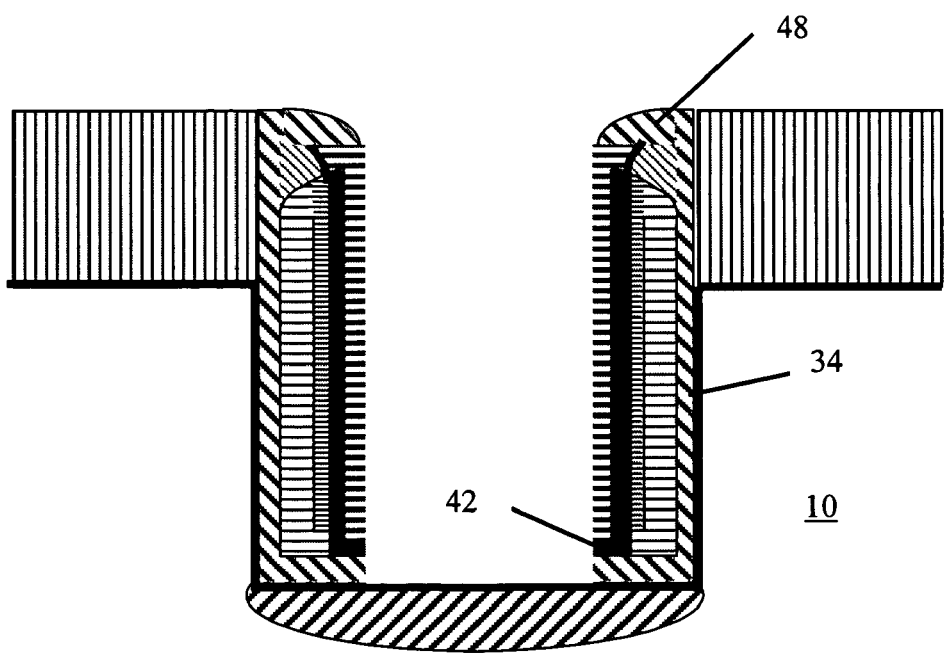

The structure shown in FIG. 2H is then subject to another HTO deposited layer of silicon dioxide 50 which lines the edge of the polysilicon 44 and the bottom wall of the pocket 30 and also covers the silicon nitride spacers 48. The resultant structure is shown in FIG. 2I.

Figure 2I:
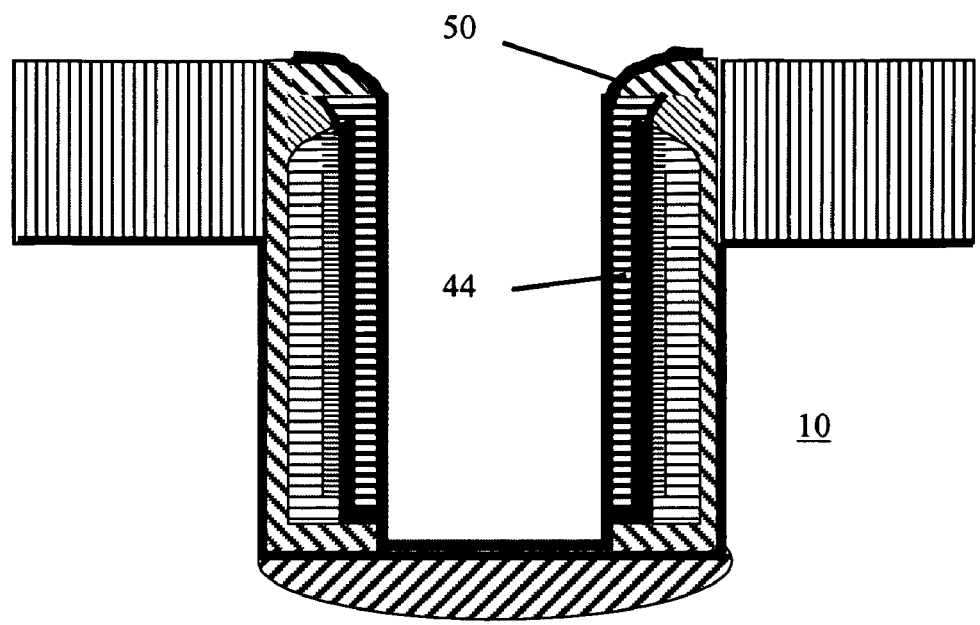

The structure in FIG. 2I is then subject to an anisotropic etch etching the silicon dioxide 50, thereby etching away the silicon dioxide 50 along the bottom of the pocket 50 immediately and directly adjacent to the substrate 10. The resultant structure is shown in FIG. 2J.

Figure 2J:
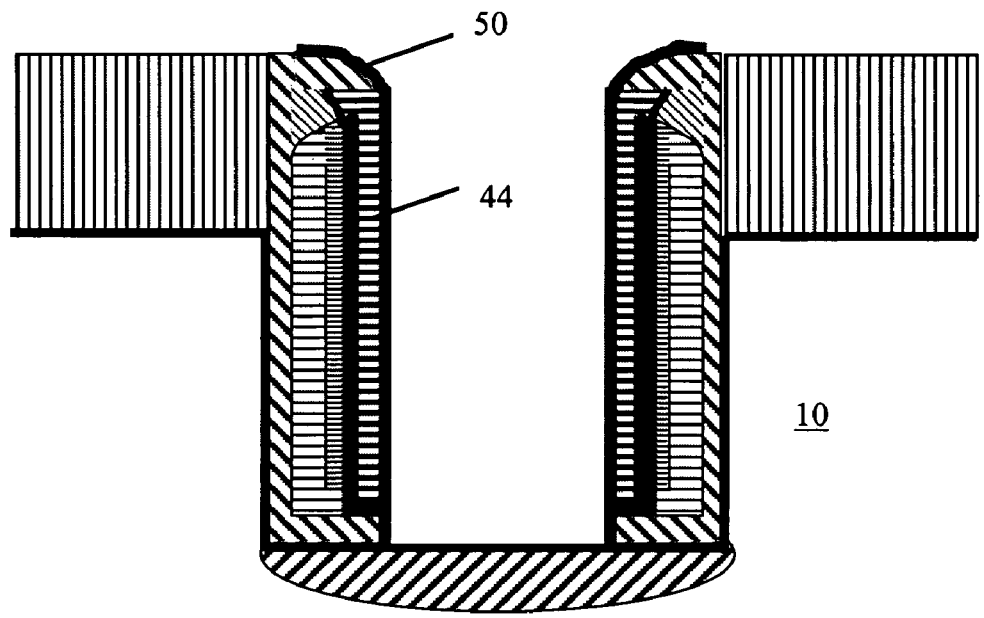

The structure shown in FIG. 2J is then subject to a cleaning process which cleans the bottom wall of the pocket 30 which is immediately adjacent to the substrate 10 and is then filled with polysilicon 52 which makes electrical contact with the implanted source/drain region 32. The resultant structure is shown in FIG. 2K.

Figure 2K:
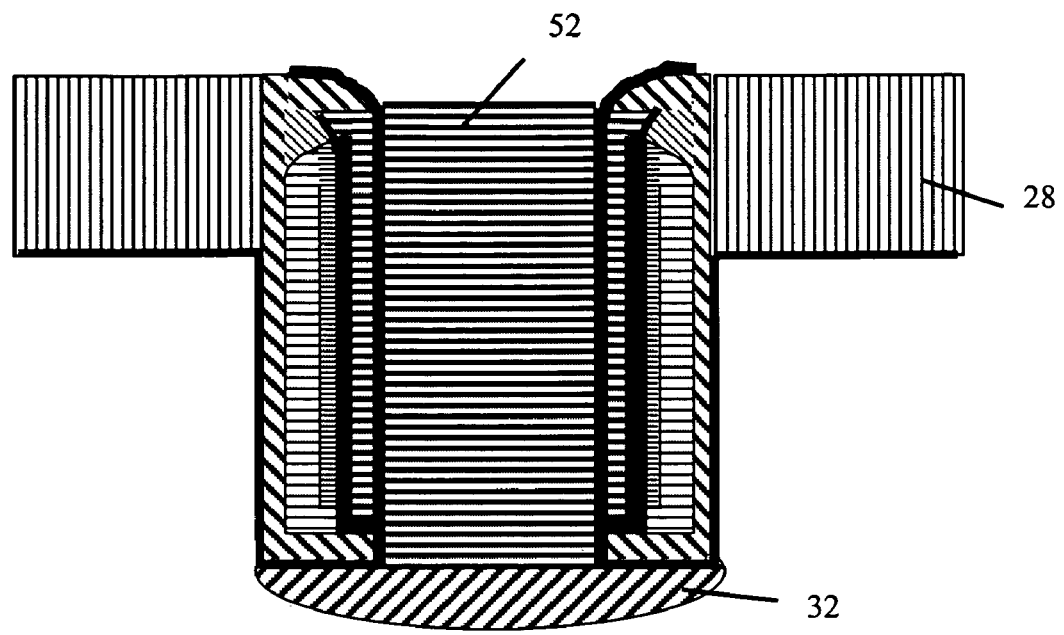
Figure 2L:
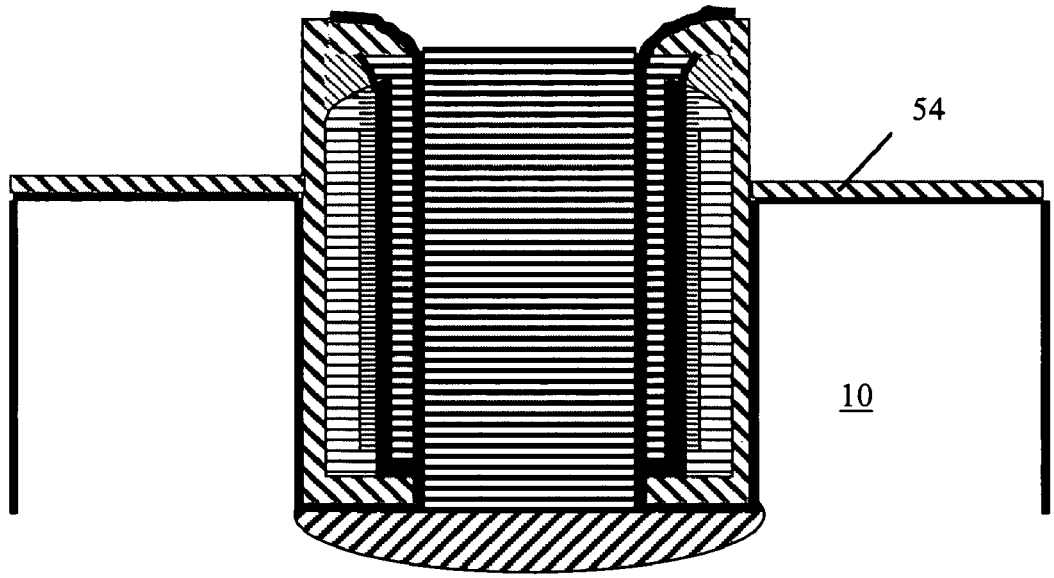

The structure shown in FIG. 2K is then subject to an anisotropic silicon nitride etch which removes the silicon nitride stripes 28 along the top surface of the substrate 10. A layer of silicon dioxide 54 which forms the gate oxide of the to-be-formed transistor is then deposited everywhere, including on the exposed surface of the silicon substrate 10. The resultant structure is shown in FIG. 2L.

Figure 2M:
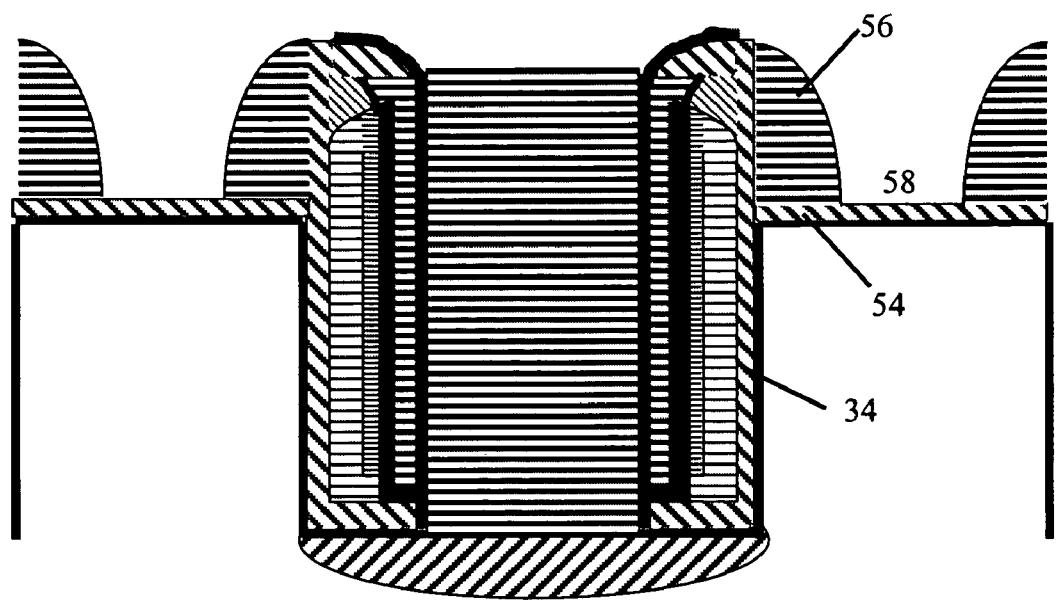
Figure 2N:
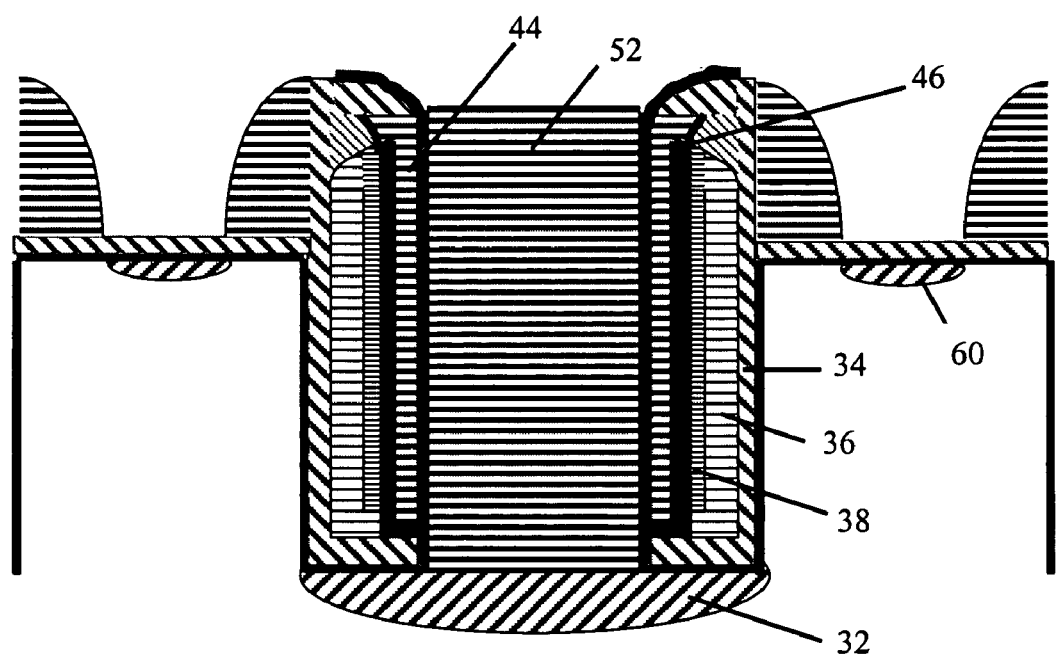

A layer of polysilicon 56 is then deposited and is then anisotropically etched back forming polysilicon spacers 56. Each of the polysilicon spacers 56 is immediately adjacent to an oxide layer 34 and is on the gate oxide 54. A gap 58 is formed between pairs of adjacent polysilicon spacers 56. The resultant structure is shown in FIG. 2M.

Finally, ion implantation is performed implanting through the gate oxide 54 to form the other source/drain region 60 through the gate oxide 54. The resultant structure is shown in FIG. 2N.

Figure 3:
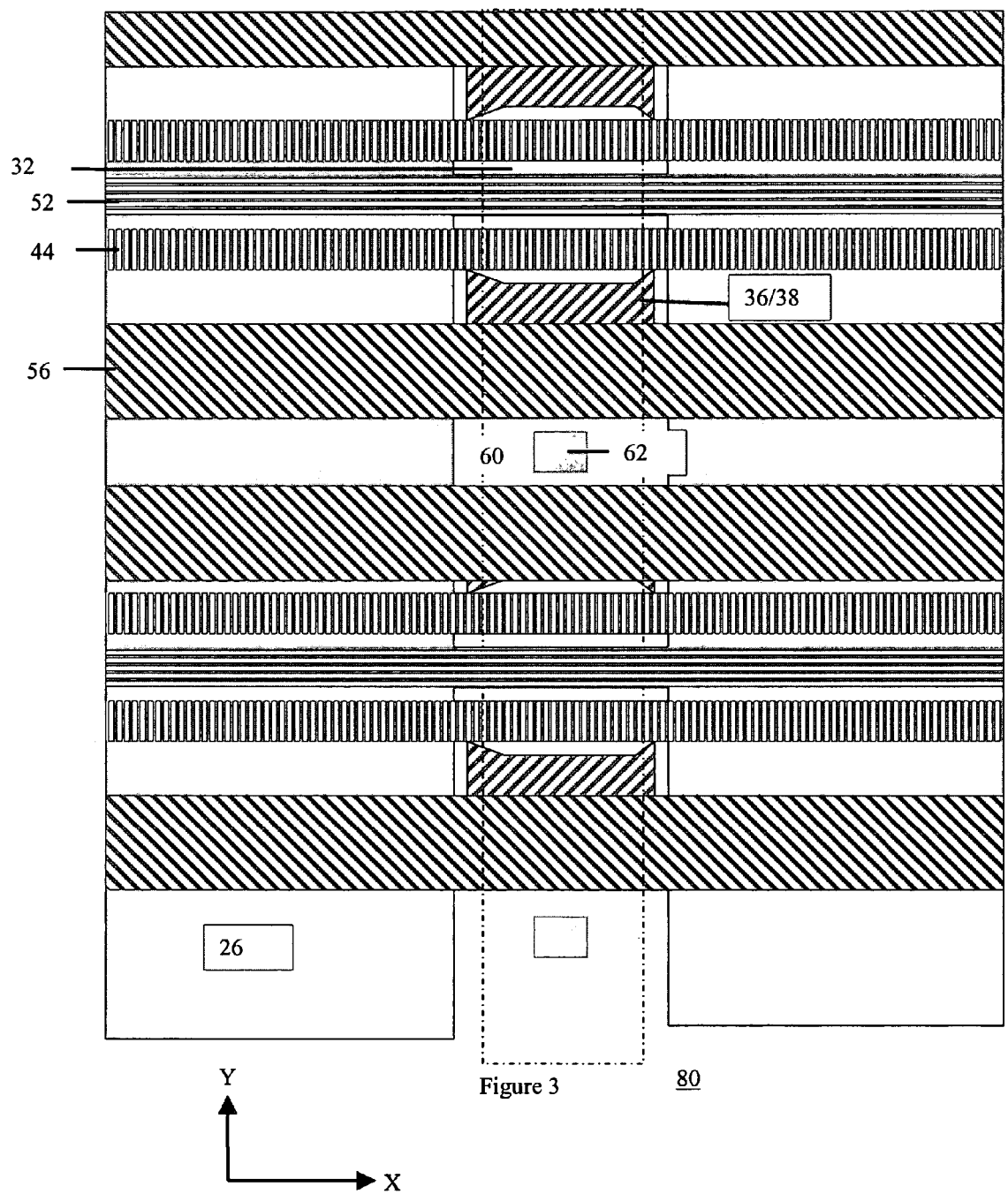
FIG. 3 is a top plan view of the memory cell array of the present invention.

Electrically, within each pocket 30 there is a region of source/drain 32, and a floating gate comprising of polysilicon 36 and 38 with a tip 46, an erase gate 44 immediately adjacent to the floating gate 36/38 but extending over the immediately adjacent STI 26 to the adjacent pocket 30 in the X direction and a conductive block of polysilicon 52 in electrical contact with the source/drain region 32 and extending in the X direction connecting to the block in the other pockets 30 in the same row. In the Y direction within an active region, a second source/drain region 60 is formed with a polysilicon 56 extending in the x direction being the gate of a transistor that is formed along the top surface of the substrate 10. The floating gate 36/38 influences the channel region which is along the side wall of the pocket 30. A top view of the structure formed by the aforementioned method is shown in FIG. 3. As can be seen in FIG. 3, the conductive polysilicon line 52 contacting the source/drain region 32 extends in the X direction. Further, the erase gate 44 also extends in the X direction connecting to the erase gate 44 in each of the pockets 30. The floating gate 36/38 is contained within a pocket 30 and is isolated from other pockets 30. The polysilicon gate 56 also extends in the X direction and connects to the gate of each of the transistors in adjacent columns. Finally, the drain/source region 60 is contained within each of the active regions. To interconnect the drain/source region 60, contact holes 62, well known in the art, are made connecting to the drain/source region 60 and are electrically connected in the y direction.

In the operation of the device 80 of the present invention, a selected cell is programmed by placing a relatively low voltage such as ground or +0.5 volts on the selected drain/source region 60. The gate 56 immediately adjacent to the selected drain/source region 60 is turned on by applying a positive voltage, thereby turning on the channel region which is along the top surface of the substrate 10. The selected block 52 of polysilicon is applied with a positive high voltage such as +8 volts which is then applied to the source/drain region 32. Finally, the selected erase gate 44 of the selected cell is applied with a positive voltage to turn on the channel region along the side wall of the pocket 30 of the selected cell irrespective of the state of the floating gate 36/38, thereby turning on the side wall channel of the selected transistor cell. This causes electrons from the drain/source region 60 to be accelerated toward the source/drain region 32 and near the junction of the top surface of the substrate 10 and the side wall of the pocket 30, the electrons experience an abrupt voltage increase and are accelerated onto the floating gate 36/38. This mechanism of hot electron programming is disclosed in U.S. Pat. No. 5,029,130 which is incorporated herein by reference and is also disclosed in U.S. patent application Ser. No. 10/757,830, filed on Jan. 13, 2004, which disclosure is also incorporated herein by reference. The mechanism of erasure is by the mechanism of poly to poly tunneling of electrons by Fowler-Nordheim tunneling. This is also disclosed in U.S. Pat. No. 5,029,130 whose disclosure is incorporated herein by reference. To erase, a positive high potential is applied to the erase gate 44. Because of the strong coupling between the erase gate 44 and the floating gate 36/38, electrons tunnel through the tip 46 onto the erase gate 44. In an erase operation, all of the transistor cells aligned in the same row as the selected erase gate 44 are erased at the same time. Finally, to read a selected transistor cell, a positive potential is applied to the drain/source region 60. A ground voltage is applied to the conducted block 52 which is applied to the drain/source region 32. A low positive voltage is applied to the erase gate 44. In the event the floating 36/38 is programmed or has electrons stored thereon, the low positive voltage applied to the erase gate 44 is not sufficient to turn on the channel region which is along the side wall of the pocket 30. Thus, no charges would traverse the channel region from the source/drain 32 to or from the drain/source 60. However, if the floating gate 36/38 is not charged or programmed, then the potential on the erase gate 44 is sufficient to turn on the side wall of the channel along the side wall of the pocket 30. The gate spacer 56 is applied with a positive potential sufficient to turn on the channel region in the top planar surface of the substrate 10. In that event, the channel region is fully turned on and charges would traverse to or from the drain/source regions 32 and source/drain region 60.

Referring to FIGS. 4A–4K, there is shown an alternative method for making an alternative non-volatile memory cell of the present invention.

Figure 4A:
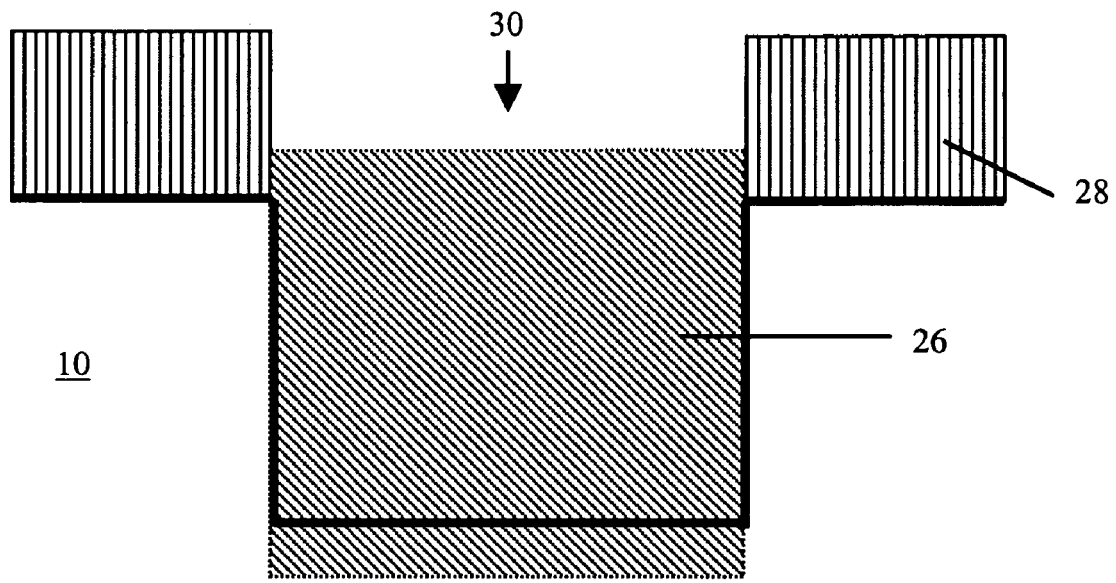
FIGS. 4A–4K are cross sectional views of the semiconductor structure in FIG. 1F taken along the line 2A—2A showing in sequence the steps in a first alternate processing embodiment of the semiconductor structure of the present invention.
Figure 4B:
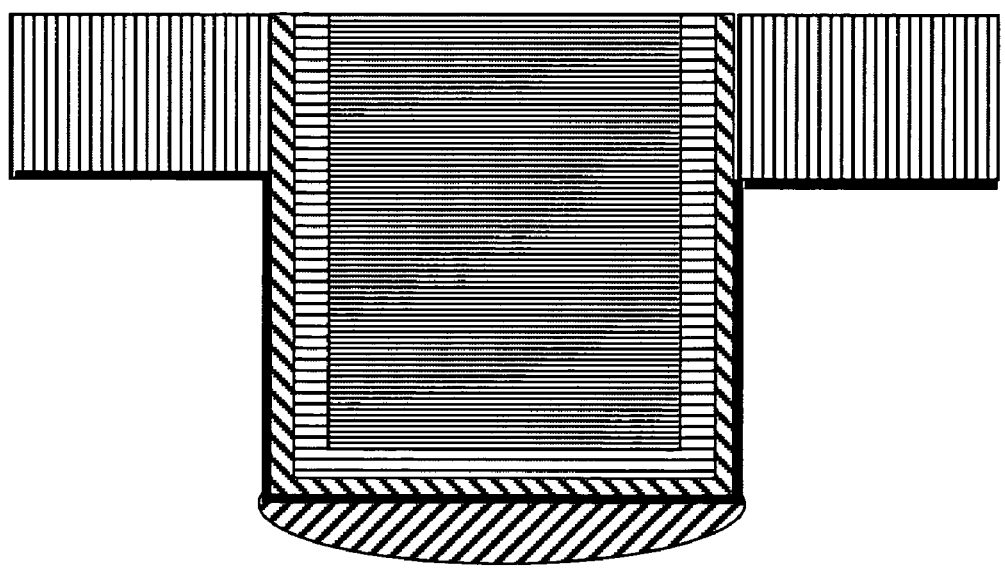
Figure 4C:
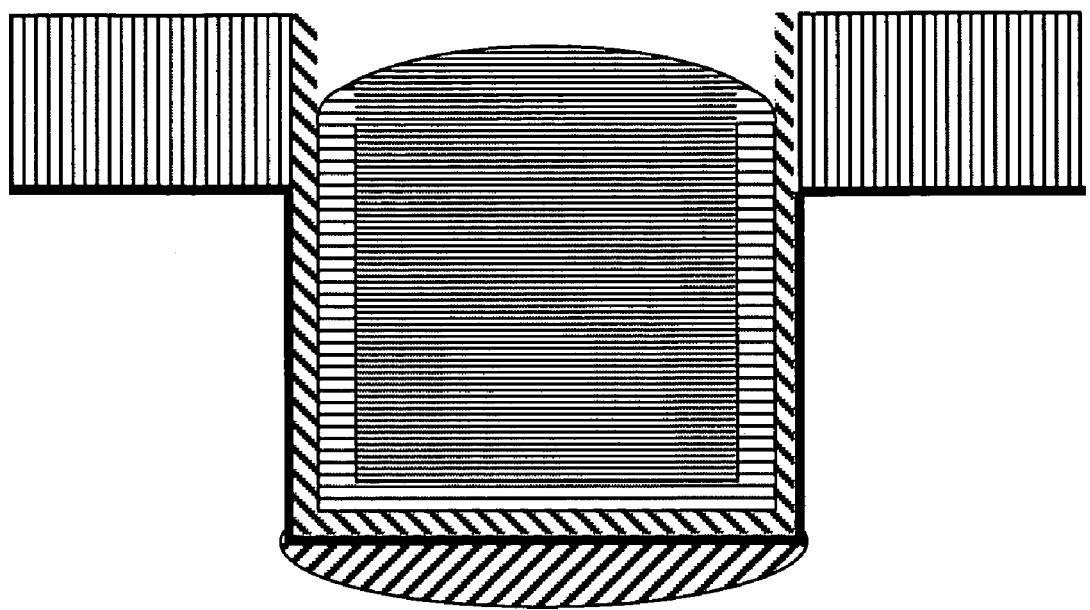
Figure 4D:
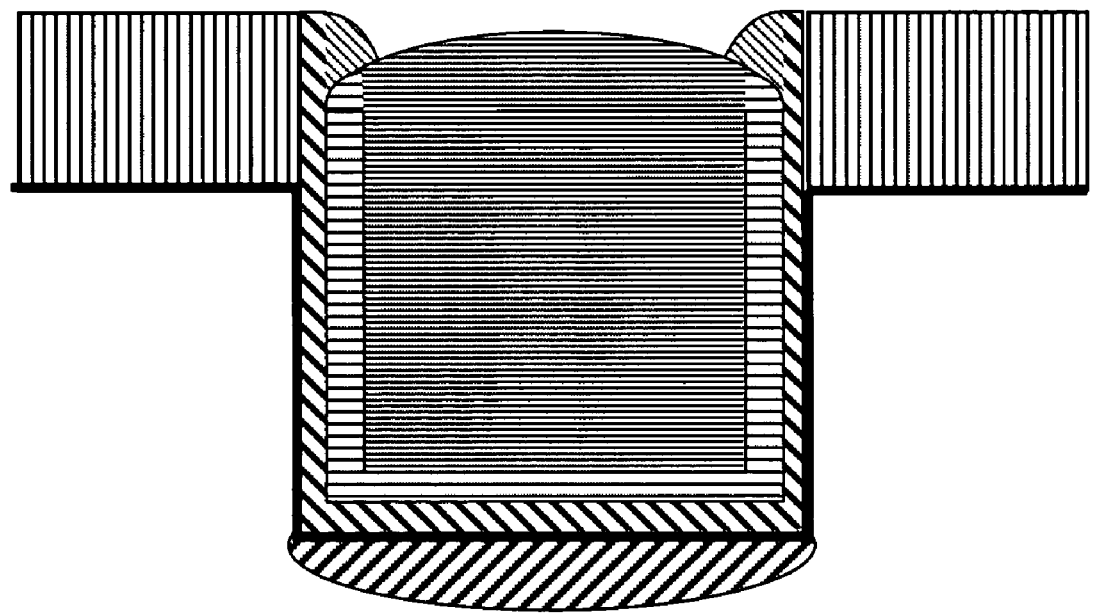
Figure 4E:
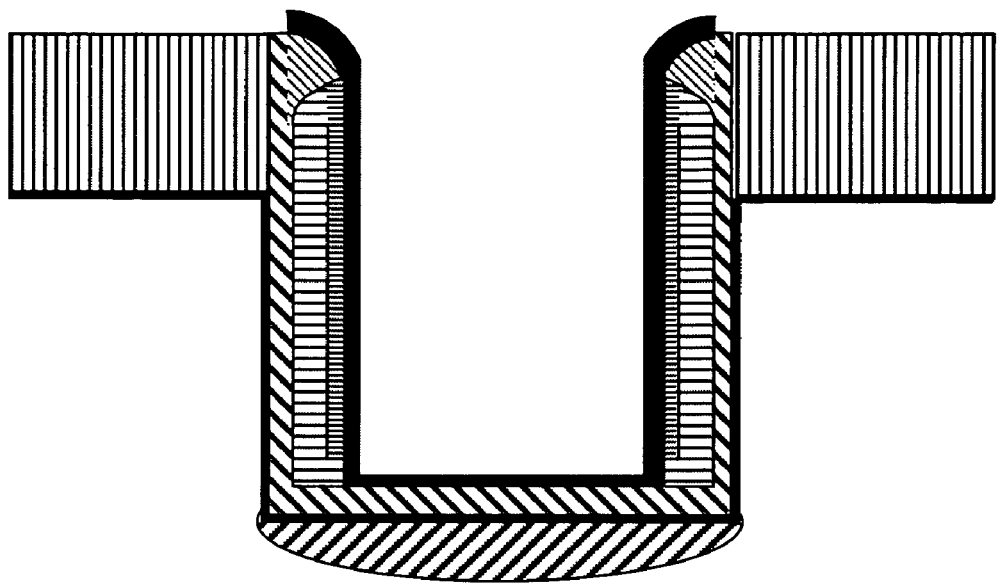

Referring to FIG. 4A, the process for forming the silicon nitride stripe 28 and the pocket 30 is the same as is described and shown in FIG. 2A.

The process and the description shown in FIGS. 4B–4E are the same as the process and method shown and described for FIGS. 2B–2E.

Unlike the method and process shown and described for FIG. 2F, the pocket 30 is first partially filled with a hydrogen rich low temperature PEDCD silicon dioxide 45. The silicon dioxide 45 is filled to a level such that it is approximately half of the pocket 30. The rest of the pocket 30 is then filled with polysilicon 44 to a level as shown and described in FIG. 2F. The resultant structure is shown in FIG. 4F.

Figure 4F:
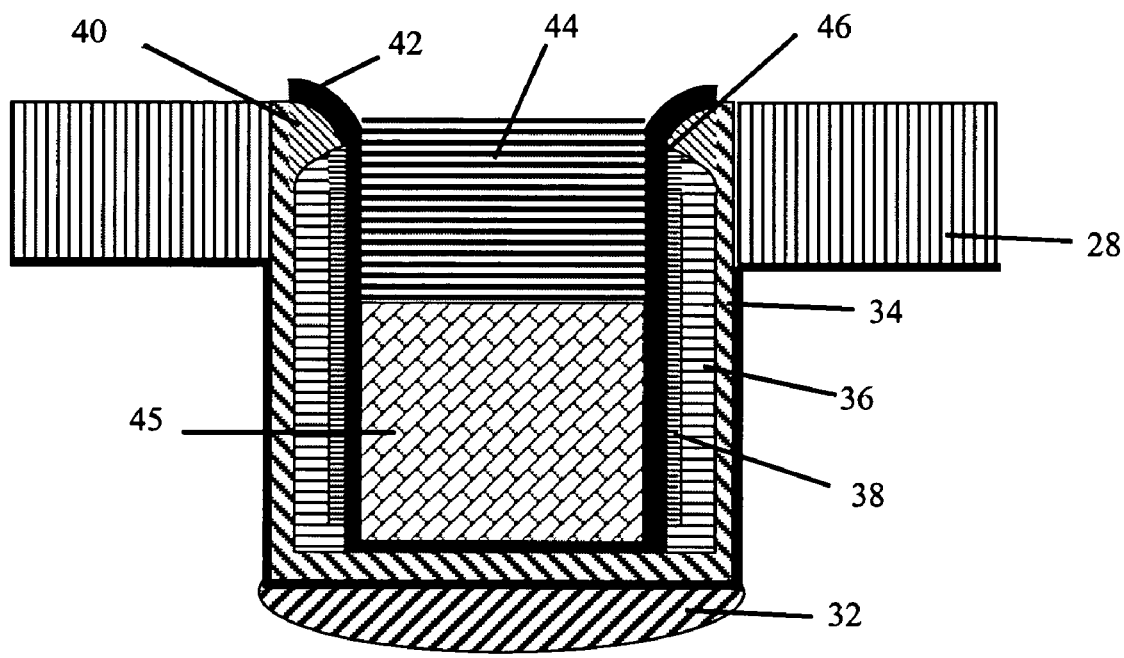
Figure 4G:
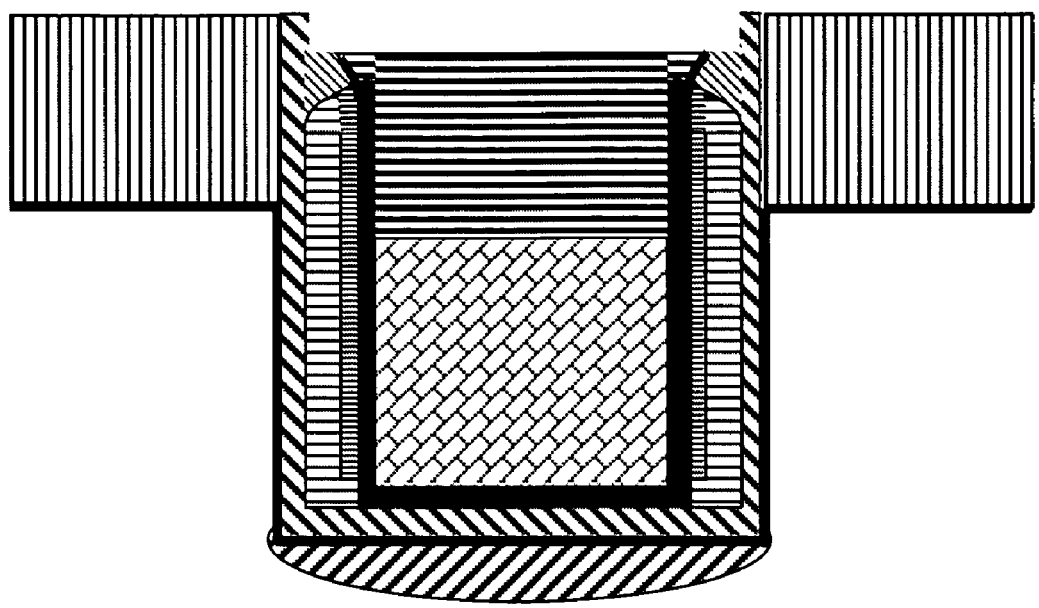
Figure 4H:
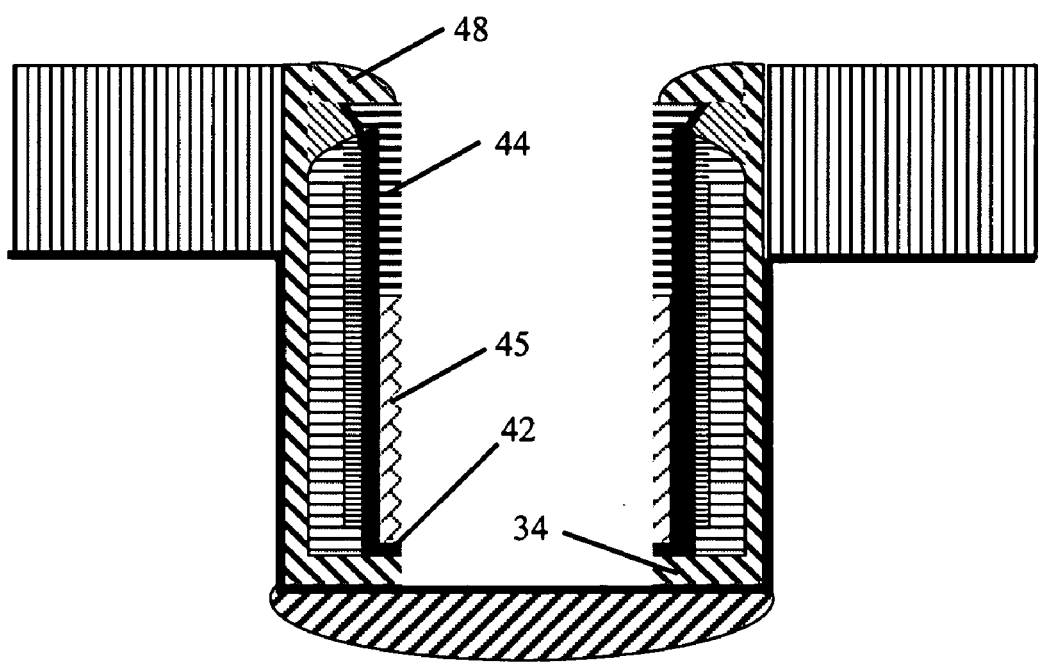

The structure shown in FIG. 4F is then processed in much the same way as the structure shown in FIG. 2F is processed resulting in the structure shown in FIG. 2G. In short, the structure is subject to a silicon nitride layer deposition which is then anisotropically etched until the top surface of the polysilicon 44 is reached with the polysilicon 44 used as an etch stop. This forms silicon nitride spacers 48 adjacent to the silicon dioxide 34. With the silicon nitride spacers 48 as masks, the polysilicon 44 is then subject to an anisotropic etch until the HTO deposited layer of silicon dioxide 42 is reached. The etchant is then changed to anisotropically etch the silicon dioxide 42 and the silicon dioxide layer 34 until the bottom of the trench which is the silicon substrate 10 is reached. The resultant structure is shown in FIG. 4H.

The hydrogen-rich, low-temperature PEDCD silicon dioxide 45 is then subject to a wet etch which preferentially etches the silicon dioxide 45 at a faster rate than the HTO deposited silicon dioxide 42. Thereafter, HTO deposited silicon dioxide 50 on the order of 200 to 800 angstroms is deposited everywhere which covers the polysilicon 44 and lines along the bottom wall of the pocket 30. The resultant structure is shown in FIG. 4I.

Figure 4I:
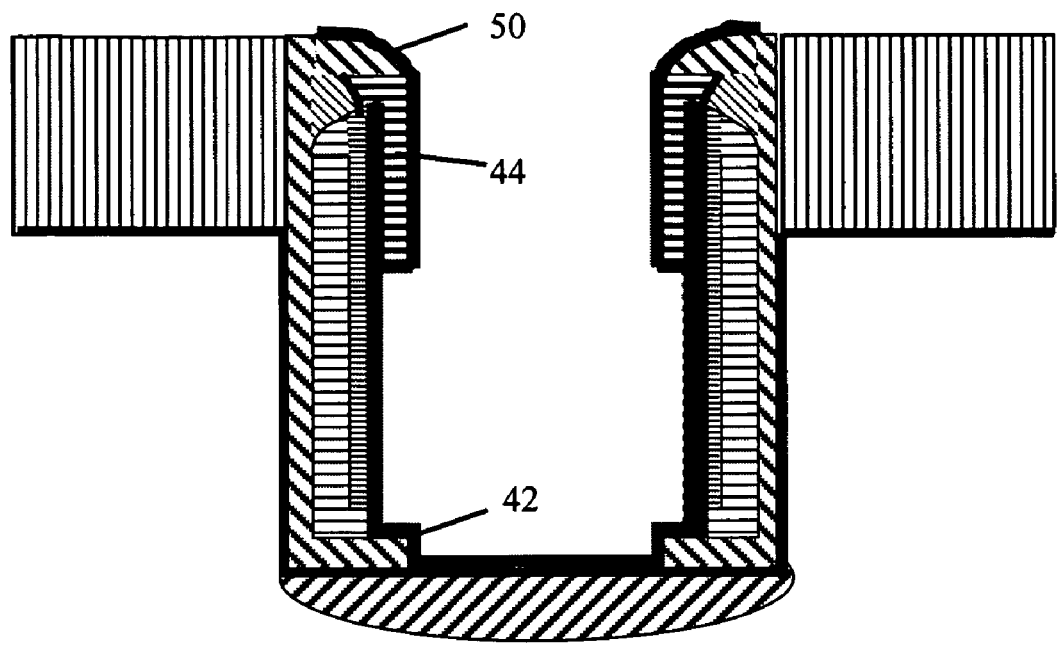

The structure shown in FIG. 4I is then subject to an anisotropic silicon dioxide etch etching away the HTO deposited silicon dioxide 50 along the bottom wall of the pocket immediately adjacent to the substrate 10. The resultant structure is shown in FIG. 4J.

Figure 4J:
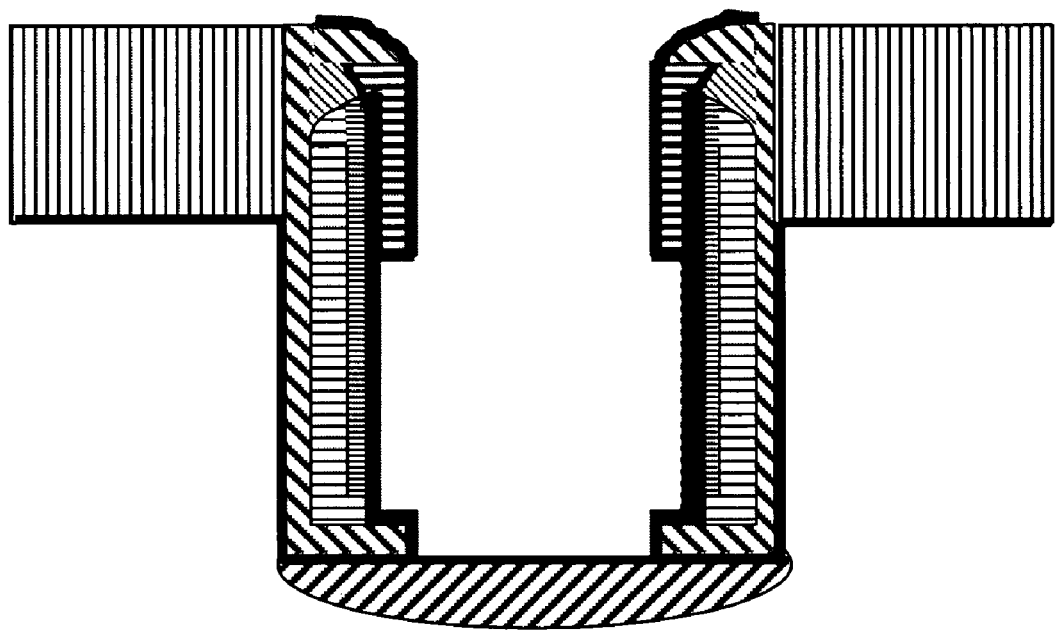

The structure shown in FIG. 4J is then subject to a polysilicon deposition which deposits polysilicon 52 into the pocket 30 and makes electrical contact with the source/drain region 32 along the bottom wall of the pocket 30. The resultant structure is shown in FIG. 4K.

Figure 4K:
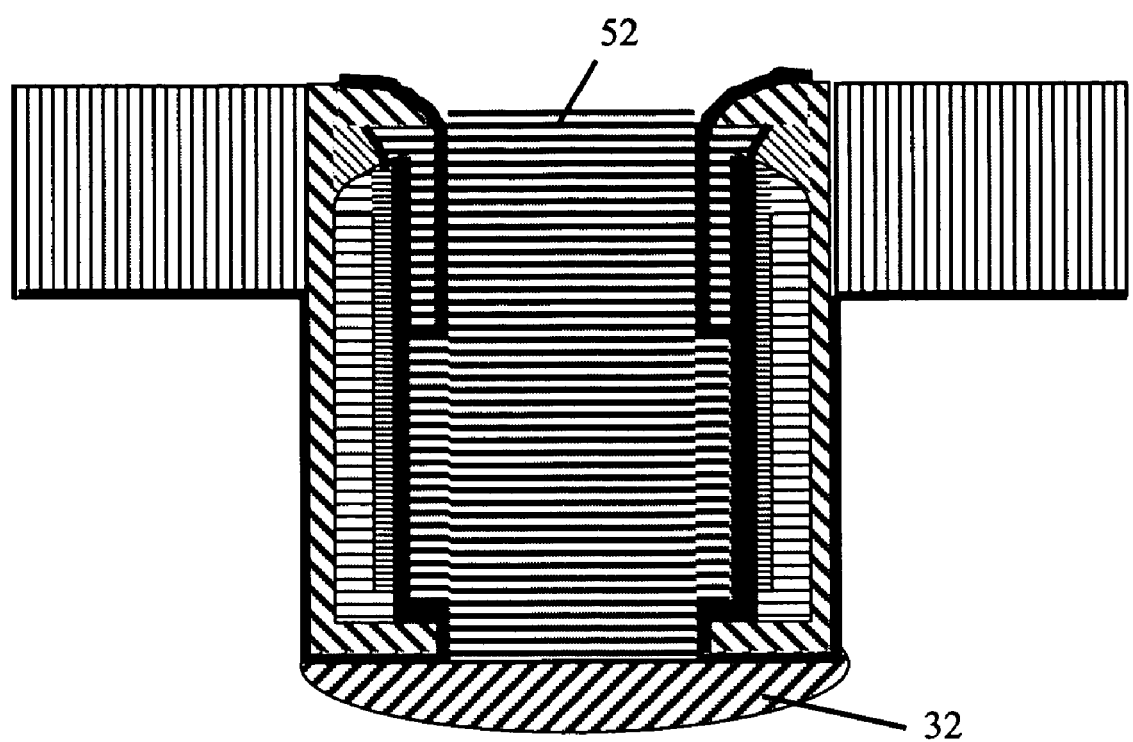

The structure shown in FIG. 4K is then processed in the same manner as the process described for the structure shown in FIG. 2L–2N. Topographically, a top view of the structure shown in FIG. 4K is identical to the structure shown in FIG. 3.

The difference between the structure shown in FIG. 4K and the structure shown in FIG. 2N is that the polysilicon block 52 which contacts the source/drain region 32 is also capacitively coupled to the floating gate 36/38. Thus, a voltage supplied to the block 52 increases the voltage coupling between the voltage supply to the coupling block 52 and the floating gate 36/38. The erase gate 44 has its length decreased, thereby decreasing the capacitive coupling between the erase gate 44 and the floating gate 36/38.

In operation, one of the differences that could result from the change in the structure as shown in FIG. 4K is that the erase gate 44 may need to be used only during the erase operation. Thus, during the programming and read operations, no voltage need to be applied to the erase gate 44. Instead, the voltage applied to the block 52 coupled to the source/drain 32 can also be electrically coupled to the floating gate 36/38.

From the foregoing, it can be seen that a highly compact, non-planar, non-volatile memory cell with a floating gate for storage of charges and with an erase gate and an array therefor and a method making the same has been disclosed.

It is to be understood that the present invention is not limited to the embodiment(s) described above and illustrated herein, but encompasses any and all variations falling within the scope of the appended claims. For example, the pockets 30 can end up having any shape that extends into the substrate, not just the elongated rectangular shape shown in the figures. Also, although the foregoing method describes the use of appropriately doped polysilicon as the conductive material used to form the memory cells, it should be clear to those having ordinary skill in the art that in the context of this disclosure and the appended claims, "polysilicon" refers to any appropriate conductive material that can be used to form the elements of non-volatile memory cells. In addition, any appropriate insulator can be used in place of silicon dioxide or silicon nitride. Moreover, any appropriate material who's etch property differs from that of silicon dioxide (or any insulator) and from polysilicon (or any conductor) can be used in place of silicon nitride. Further, as is apparent from the claims, not all method steps need be performed in the exact order illustrated or claimed, but rather in any order that allows the proper formation of the memory cell of the present invention. Additionally, the above described invention is shown to be formed in a substrate which is shown to be uniformly doped, but it is well known and contemplated by the present invention that memory cell elements can be formed in well regions of the substrate, which are regions that are doped to have a different conductivity type compared to other portions of the substrate. Lastly, single layers of insulating or conductive material could be formed as multiple layers of such materials, and vice versa.

What is claimed is:

1. An electrically programmable and erasable memory device comprising:

a substrate of semiconductor material having a first conductivity type and a horizontal surface;

a trench formed into the surface of the substrate;

first and second spaced-apart regions formed in the substrate and having a second conductivity type, with a channel region formed in the substrate therebetween, wherein the first region is formed underneath the trench, and the channel region includes a first portion that extends substantially along a sidewall of the trench and a second portion that extends substantially along the surface of the substrate;

an electrically conductive floating gate having at least a lower portion thereof disposed in the trench adjacent to and insulated from the channel region first portion for controlling a conductivity of the channel region first portion;

an electrically conductive erase gate having at least a lower portion thereof disposed in the trench adjacent to and insulated from the floating gate; and an electrically conductive control gate disposed over and insulated from the channel region second portion for controlling a conductivity of the channel region second portion.

2. The device of claim 1, wherein the channel region first and second portions are non-linear with respect to each other, with the channel region second portion extending in a direction directly toward the floating gate to define a path for programming the floating gate.

3. The device of claim 2, further comprising:
a block of conductive material having at least a lower portion thereof disposed in the trench adjacent to and insulated from the erase gate.

4. The device of claim 3, wherein the conductive material block is electrically connected to the first region.

5. The device of claim 2, wherein the erase gate is disposed adjacent to the floating gate and insulated therefrom with insulation material having a thickness that permits Fowler-Nordheim tunneling.

6. The device of claim 2, further comprising:
said floating gate having a tip directed to said erase gate for facilitating the removal of charges from the floating gate to the erase gate.

7. The device of claim 6, wherein the erase gate extends into the trench and is substantially of the same length as the length of an adjacent floating gate.

8. The device of claim 6, wherein the erase gate extends into the trench and is substantially shorter than the length of an adjacent floating gate.

9. The device of claim 6 wherein said erase gate is of a conductive material.

10. The device of claim 9, wherein the control gate is of a conductive material.

11. The device of claim 1, wherein the floating gate is of a conductive material.

12. An array of electrically programmable and erasable memory devices comprising:
a substrate of semiconductor material having a first conductivity type and a surface;
spaced apart isolation regions formed on the substrate which are substantially parallel to one another and extend in a first direction, with an active region between each pair of adjacent isolation regions; and
each of the active regions including a plurality of pairs of memory cells, wherein each of the memory cell pairs comprises:
a trench formed into the surface of the substrate and including a pair of opposing sidewalls;
a first region formed in the substrate underneath the trench;
a pair of second regions formed in the substrate, with a pair of channel regions each formed in the substrate between the first region and one of the second regions, wherein the first and second regions have a second conductivity type, and wherein each of the channel regions includes a first portion that extends substantially along one of the opposing trench sidewalls and a second portion that extends substantially along the substrate surface;
a pair of electrically conductive floating gates each having at least a lower portion thereof disposed in the trench adjacent to and insulated from one of the channel region first portions for controlling a conductivity of the one channel region first portion;
a pair of electrically conductive erase gates each having at least a lower portion thereof disposed in the trench adjacent to and insulated from one of the floating gates; and a pair of electrically conductive control gates each disposed over and insulated from one of the channel region second portions for controlling a conductivity of the one channel region second portion.

13. The array of claim 12, wherein each of the memory cell pairs further comprises:
a block of conductive material having at least a lower portion thereof disposed in the trench adjacent to and insulated from the pair of erase gates.

14. The array of claim 13, wherein each of the conductive material blocks is electrically connected to one of the first regions.

15. The array of claim 14 further comprising:
a plurality of spaced apart first conduction lines extending substantially parallel to one another in a second direction, substantially perpendicular to the first direction, wherein each first conduction line is connected to the block of conductive material disposed in the trench.

16. The array of claim 15 further comprising:
a plurality of spaced apart second conduction lines extending substantially parallel to one another in the second direction, wherein each second conduction line is connected to one of the pair of erase gates in the trench.

17. The array of claim 16 further comprising:
a plurality of spaced apart third conduction lines extending substantially parallel to one another in the second direction, wherein each third conduction line is connected to a control gate.

18. The array of claim 17 further comprising:
a plurality of spaced apart fourth conduction lines extending substantially parallel to one another in the first direction, wherein each fourth conduction lines is connected to a second region.

19. The array of claim 12, wherein each of the erase gates is disposed adjacent to one of the floating gates and insulated therefrom with insulation material having a thickness that permits Fowler-Nordheim tunneling.

20. The array of claim 19, further comprising: said floating gate having a tip directed to said erase gate for facilitating the removal of charges from the floating gate to the erase gate.

21. The array of claim 12 wherein each of the erase gates extends into a trench and is substantially of the same length as the length of an adjacent floating gate.

22. The array of claim 12 wherein each of the erase gates extends into a trench and is substantially shorter than the length of an adjacent floating gate.

23. The array of claim 12, wherein each of the floating gates is of a conductive material.

24. The array of claim 12, wherein first and second portions for each of the channel regions are non-linear with respect to each other, with each of the channel region second portions extending in a direction directly toward one of the floating gates to define a path for programming the one floating gate.

* * * * *